(12) United States Patent
Soubh et al.

(10) Patent No.: US 6,575,772 B1
(45) Date of Patent: Jun. 10, 2003

(54) SHIELDED CABLE TERMINAL WITH CONTACT PINS MOUNTED TO PRINTED CIRCUIT BOARD

(75) Inventors: Emad Soubh, Camas, WA (US); Dan DeLessert, Newberg, OR (US); Jon Hoffman, Vancouver, WA (US)

(73) Assignee: The Ludlow Company LP, Chicopee, MA (US)

( * ) Notice: Subject to any disclaimer, the term of this patent is extended or adjusted under 35 U.S.C. 154(b) by 0 days.

(21) Appl. No.: 10/119,879

(22) Filed: Apr. 9, 2002

(51) Int. Cl.[7] ............................................... H01R 12/00
(52) U.S. Cl. ........................ 439/76.1; 439/700; 439/581
(58) Field of Search ............................... 439/76.1, 700, 439/581, 912, 607, 610; 437/63

(56) References Cited

U.S. PATENT DOCUMENTS 6,007,347 A * 12/1999 Keldsen et al. ............... 439/63
6,053,777 A * 4/2000 Boyle .......................... 439/700
6,106,304 A * 8/2000 Huang ........................... 439/63
6,328,588 B1 * 12/2001 Tsai et al. .................... 439/352
6,358,062 B1 * 3/2002 Feldman et al. ............... 439/63
6,371,805 B1 * 4/2002 Wang et al. ................. 439/581

* cited by examiner

*Primary Examiner*—Gary Paumen
*Assistant Examiner*—James R. Harvey
(74) *Attorney, Agent, or Firm*—Langlotz Patent Works, Inc.; Bennet K. Langlotz

(57) ABSTRACT

A cable assembly includes a printed circuit board having a pattern of conductive traces on a major surface of the board. The cable has a number of conductors electrically connected to the traces, and a number of elongated spring contact elements are connected to the board. Each contact element has a sleeve oriented parallel to the major surface and connected to a first pad portion of a selected trace. Each contact element has an spring pin slidably received in the sleeve and extending beyond a first peripheral edge portion of the board.

20 Claims, 3 Drawing Sheets

SHIELDED CABLE TERMINAL WITH CONTACT PINS MOUNTED TO PRINTED CIRCUIT BOARD

FIELD OF THE INVENTION

This invention relates to electrical cable terminals, and more particularly to terminals for high speed cables with multiple conductors.

BACKGROUND OF THE INVENTION

Certain high speed electronic cable terminals employ arrays of spring pins to contact pads or lands of a circuit board or integrated circuit under test, or to contact connections of an electronic device for a permanent connection. The spring pins are straight, elongated pins received in cylindrical sleeves, and which are axially biased by spring pressure to an extended position. All pins extend in the same direction, with all the pin tips in a common plane. Contact is made by aligning the terminal with the device being probed or contacted, and applying axial pressure to ensure contact by each pin with a minimum pressure. The range of motion of each pin accommodates contour variations in the device being contacted, and slight variations in the position of each pin.

For applications in which very high frequency signals are to be transmitted, the cable to which the terminal is connected may be formed of coaxial wires, each shielded to provide consistent performance and to prevent cross talk and other electronic interference. Where the cable joins the terminal, and within the terminal, discontinuities may occur that limit performance. To minimize these discontinuities, existing terminals employ special pin assemblies that essentially preserve the coaxial nature of the cable. Each pin in such assemblies is received in a thin inner conductive sleeve within an insulating cylindrical body that is sized to match the dielectric layer that surrounds the central conductor of the cable wire. A metal sleeve surrounds the body, analogous to the cable wire shield. Hereafter, these assemblies referred to as matched impedance spring pins. To join the cable to the pin assembly, the cable's central conductor is soldered to the inner sleeve, and an outer junction sleeve is soldered to the cable shield and the assembly's outer sleeve, spanning the gap to provide an effectively continuous shield to the point where the pin protrudes from the body. To align several of these assemblies to form an array, a conductive block having an array of bores is used. Each bore is precisely sized to receive the outer sleeve of each assembly. Bore size and sleeve diameter must be closely controlled with very limited tolerance for variation. If the fit is too loose, there will be limited points of contact, and the grounding and shielding effect of the block will be non-uniform. If the fit is too tight, the dielectric body of the pin assembly may be compressed, changing the dielectric gap, and altering performance characteristics. The matched impedance spring pins must also be precisely manufactured to maintain consistent diameters. Manufacturing tolerances result in a minimum number of interference points between the matched impedance spring pin outside diameter and the conductive block inside diameters. These minimal contacts result in ground return path inconsistencies reducing the electrical signal integrity.

To provide these close tolerances requires manufacturing techniques that substantially increase component part cost. In addition, the assembly time and cost is significantly high, because each pin assembly must be separately connected to the cable, so that labor costs increase with the number of pins employed.

In addition, the pin assemblies have outer diameters determined by the dielectric thickness needed to match that of the cable wires. This diameter limits the spacing of the pin contact points, preventing spacings less than the outer sleeve diameter. In some applications, especially where many contacts are required, or where test pads are required to occupy valuable space on a printed circuit wafer or board, this necessarily wide spacing increases costs.

SUMMARY OF THE INVENTION

The present invention overcomes the limitations of the prior art by providing a cable assembly. The cable assembly includes a printed circuit board having a pattern of conductive traces on a major surface of the board. The cable has a number of conductors electrically connected to the traces, and a number of elongated spring contact elements are connected to the board. Each contact element has a sleeve, known as a receptacle, oriented parallel to the major surface and connected to a first pad portion of a selected trace. Each contact element has an axially movable pin, known as a spring pin, slidably received in the receptacle and extending beyond a first peripheral edge portion of the board. The position of the electrical elements of the design are located to simulate the performance of a matched impedance spring pin assembly.

DETAILED DESCRIPTION OF A PREFERRED EMBODIMENT

Figure 1:
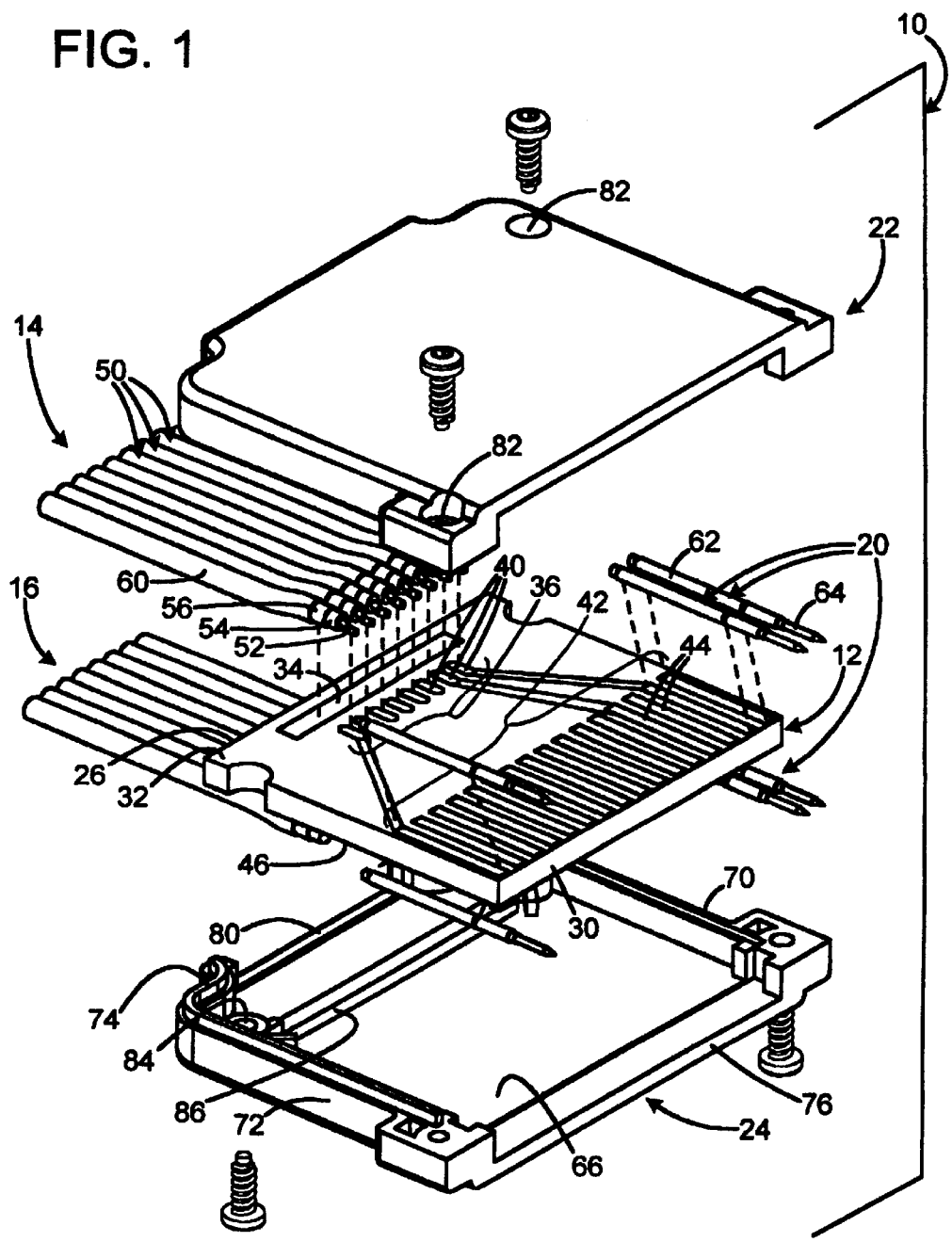
FIG. 1 is an exploded perspective view of a cable terminal assembly according to a preferred embodiment of the invention.

FIG. 1 shows an exploded view of a cable terminal 10. The terminal includes a printed circuit board 12 to which are connected a first ribbon cable 14, and a second ribbon cable 16. A plurality of spring pins 20 are also connected to the board. A housing having an upper shell half 22 and a lower shell half 24 enclose the board.

The printed circuit board is a generally rectangular shape having a cable attachment edge 26 and an opposed pin attachment edge 30. The board includes a pattern of exposed pads and covered traces, all formed of conductive material such as copper foil. Referring to an upper major face 32 of the board, the pattern includes an elongated ground bar 34 parallel to and adjacent to the cable attachment edge 26. Adjacent to and parallel to the ground bar is an array 36 of separate signal pads 40, each pad being perpendicular to edge 26.

An array 42 of elongated pin attachment pads 44 is positioned along the entire length of the pin attachment edge 30 of the board. Each pad is an exposed elongated element having an axis perpendicular to the board edge 30. The array 42 has an odd number of pads, with the end most pads being considered as odd numbered. All odd numbered pads are connected by way of traces on the board surface, and/or buried ground planes to be discussed below, to the ground bar 34. The interspersed even pads are each independently connected to a corresponding signal pad 40.

The board has a lower major face 46 that is patterned the same as the upper face 32, so that all features and functions of the upper surface have a corresponding feature or function on the lower surface. The board includes multiple buried ground planes at different depths, as will be discussed below with respect to FIG. 2. In the preferred embodiment, the board is 1.395 inch wide by 0.935 inch long (from edge 26 to edge 30). It has a thickness of 0.086 inch, and is formed of GETEK laminates. The ground bar 34 is 0.10 inch wide and 0.71 inch long. There are 16 signal pads 40 on each face in the preferred embodiment, although this may be varied depending on the application. The signal pads are spaced apart at 0.066 inch center to center, and each pad is 0.035 inch wide and 0.090 inch long. The pin pads 44 are spaced apart at 0.075 inch center to center, and each pad is 0.025 inch wide and 0.50 inch long.

The cables 14 and 16 are identical, each with 16 wires 50 (the number of which may vary as noted above with respect to the signal pads.) Each cable is formed as a ribbon with the wires connected to each other side-by-side, at least at the ends. The wires are coaxial, with a central signal-carrying conductor 52 surrounded by a dielectric 54, which is wrapped by a conductive shield 56. A jacket 60 surrounds the shield. In the preferred embodiment, the central conductor is 26 gauge, the dielectric has a diameter of 0.053 inch, and the shield is a copper foil. The jacket is formed of PVC. The wires are arranged with a spacing of 0.066 inch, the same as that of the signal pads 40 on the board.

The spring pins 20 each include a metal sleeve 62 that receives a pin 64. An end portion of the pin protrudes from one end of the sleeve, and the pin slides axially within the sleeve. A spring in the sleeve at the other end biases the pin to an extended position (shown), and allows the pin to move into the sleeve under axial pressure, such as when the pin assembly is pressed toward a hard surface. In the preferred embodiment, the spring pin is a Series S, Size 0 model from (IDI) of (KS, MO). The receptacle has an outer diameter of 0.034 inch, and a length of 0.52 inch. The pin protrudes from the sleeve a distance of 0.140 inch, and has a diameter of 0.021 inch. The spring is pre-loaded to provide a biasing force of 0.6 ounce when the pin is in the extended position. The sleeve and pin are formed of nickel/silver, gold plated and gold plated beryllium copper respectively.

The housing elements 22, 24 are essentially identical. Each is a tray-shaped shell having a planar major wall 66, with peripheral side walls 70, 72, and a single end wall 74 extending perpendicularly from the major wall. The major wall 66 may incorporate features which vary in distance from the electrical elements of the board assembly 12. These features exist to maintain the consistency of the electrical ground return path (impedance). A front edge 76 of the major wall 66 has no wall attached. The end wall defines a cutout 80 that is a central section of the wall having a lower rim. The edges of the end wall at the cutout are semi-circularly radiused to receive a cable without sharp corners that may generate strain and impair cable performance. The inner surfaces of the housing elements are coated with a conductive material such as Chomerics CHO-Shield coatings to provide a shield against electrical and magnetic interference. The inner surfaces include all surfaces that face the printed circuit board 12. Thus, when assembled, there is a metallic enclosure that it open only at the slot to receive the cable, and at the side where the pins protrude. The housing is formed of (material), and has a typical wall thickness of 0.040 inch. A pair of screw fasteners is used to secure the halves together, passing through bores 82 in the upper half 22, and engaging smaller bores 84 in the lower half.

Figure 2:
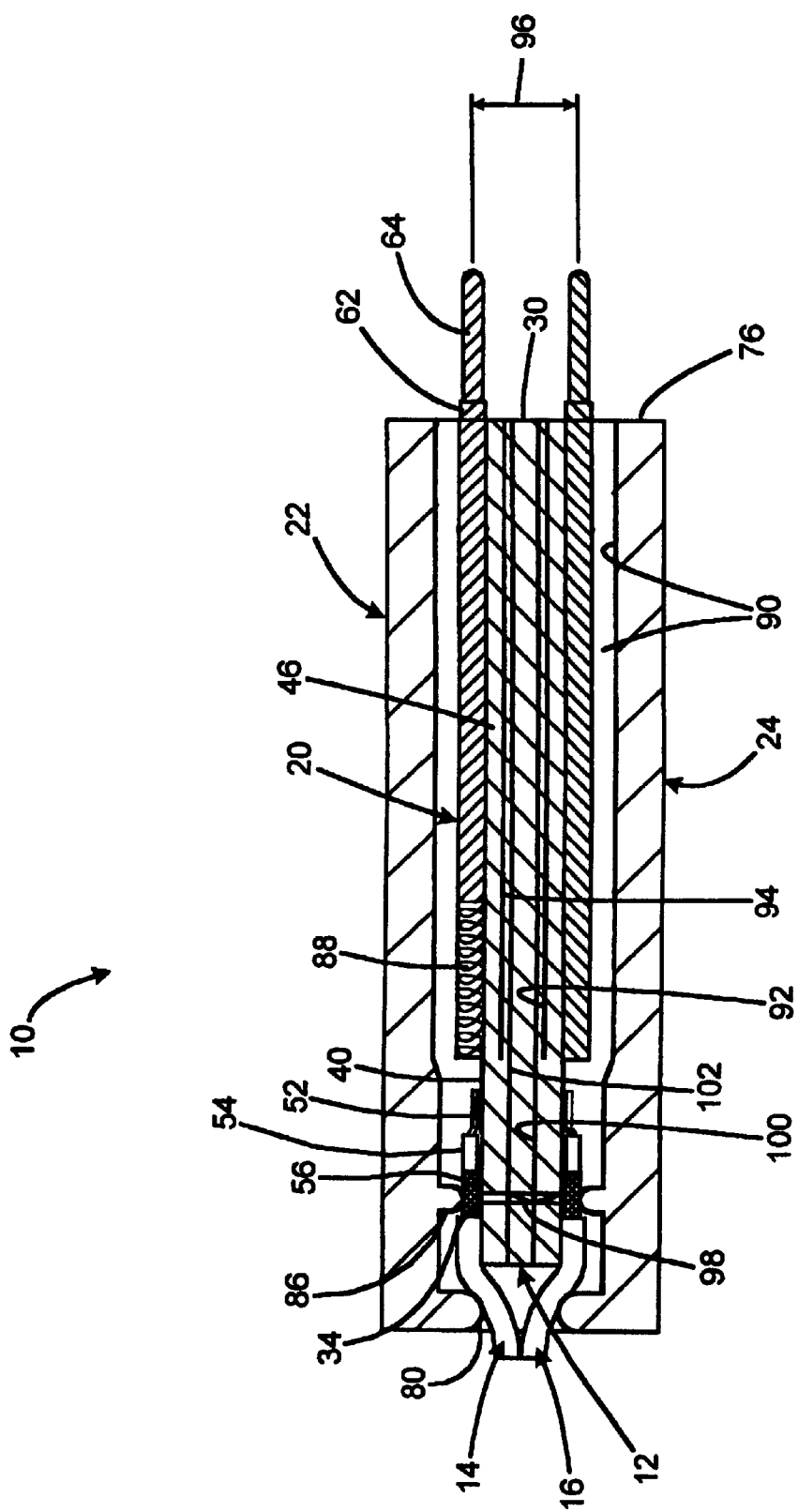
FIG. 2 is sectional side view of the assembly of FIG. 1.

FIG. 2 shows the assembled terminal 10. The sleeves 62 of the spring pins 20 are soldered to the spring pin pads 46, so that the free ends of the pins protrude beyond the edge 30 of the board 12, and beyond the edge 76 of the housing elements 22, 24. Each spring pin element contains a compressed coil spring 88 as illustrated. The cables 14, 16 are connected to the board, with each exposed central conductor 52 soldered to a respective pad 40, and all the shields of each ribbon soldered to the ground bar 56. The ribs 86 press against the shields, so that the conductive layer 90 makes ohmic contact to ground the housing.

The board 12 has several interior buried ground planes. At a minimum, the board has two ground planes 92, 94, each equally spaced apart from the nearest major surface. The requirement for two ground planes exists because the spacing 96 between the rows of pins is pre-defined by design rules and the needs of the application. However, the spacing of the ground plane from the surface conductors is based on electrical design factors that are used to generate performance characteristics comparable to the coaxial wires. The housing conductive layer 90 and ground plane serve the same function as the shield of the coaxial wire; the alternating grounded pins provide lateral shielding with respect to adjacent pins. A ground via 98 connects to all of the ground planes, and to the ground bars 34. The number and placement of the ground vias will vary with different designs.

In addition, different portions of the board and circuit may have different impedance characteristics, and may require different ground plane spacings to achieve uniform impedance results. Ground planes may also reside on the outer surfaces of the board, to provide improved additional shielding and improve the ground return path of the signals. In the illustrated embodiment, ground planes 92 and 94 extend under the region of the pins. Deeper ground planes 100, 102 serve to provide shielding and impedance control away from the pins, where foil traces extend across the circuit board. Although not shown, there are connections between the ground planes 100, 102 and the via 98.

Figure 3:
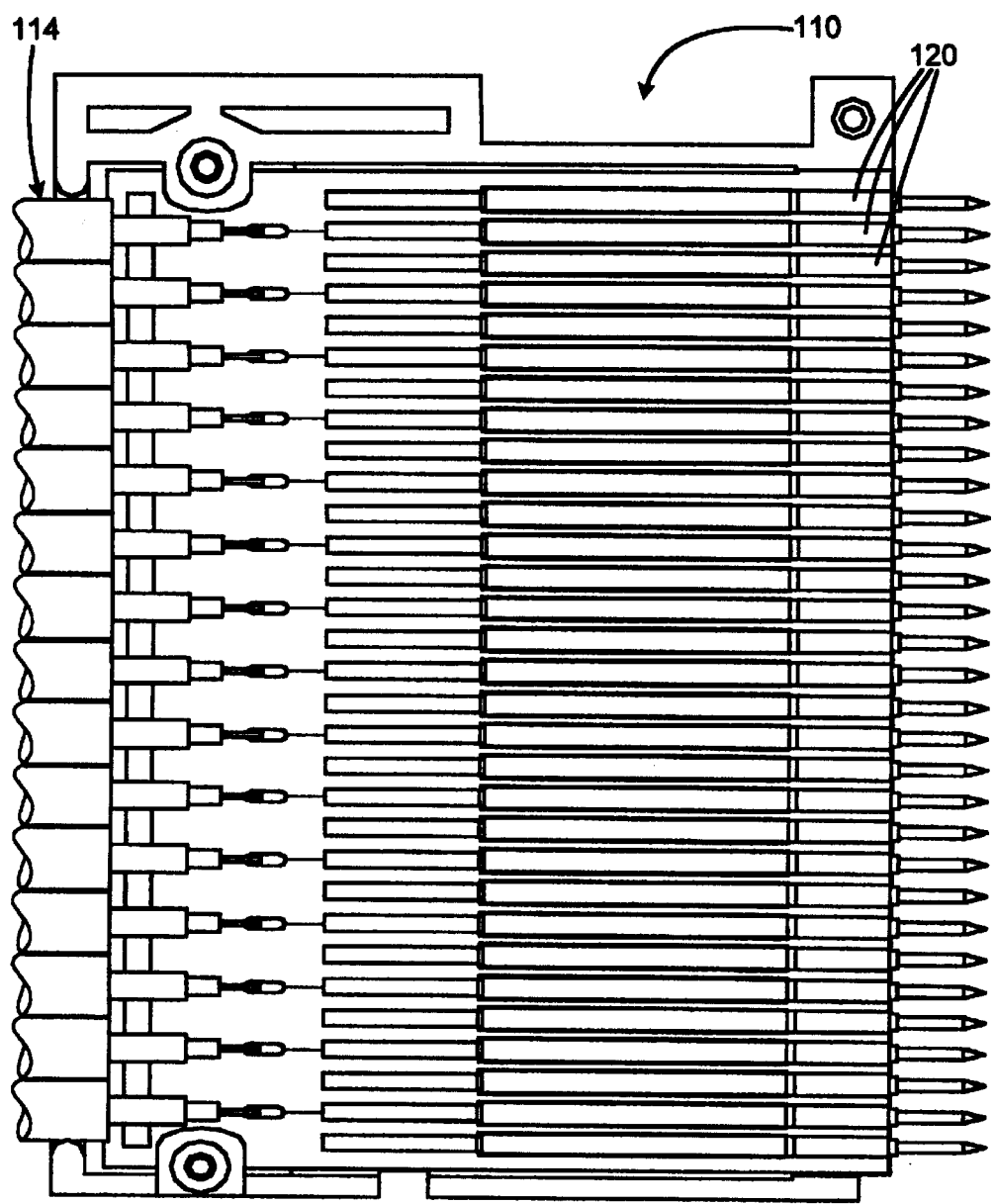
FIG. 3 is a plan view of an alternative embodiment of the invention.

FIG. 3 shows a plan view of an alternative embodiment terminal 1 10, with one cover removed. The cable 1 14 has a wire spacing that is much wider than in the preferred embodiment, and much wider that the spacing of the pins 120. In this embodiment, the spacing between the pins is half the wire spacing, although the relative ratio may be varied in other alternative embodiments. It is advantageous that the pin diameter is not inherently as large as the wire diameter as in the prior art, because shielding is provided by the ground plane, plated housing, and adjacent ground pins, which may be spaced apart at any distance without limiting spring pin spacing. The spring pin spacing may thus be well less than the wire shielding diameter, and the spring pins may be miniaturized to any practical small diameter to achieve a spacing that may be even finer relative to the wire spacing than in the illustrated embodiment. Other versions may use wire having slightly smaller diameter than illustrated, so that the spacing ratio is less than the 2:1 ratio illustrated here.

The spring pins and receptacles were chosen in concert with the locations of ground planes and the design of the housing to preserve the matched impedance characteristics of the electrical signal.

While the above is discussed in terms of preferred and alternative embodiments, the invention is not intended to be so limited.

What is claimed is:

1. A cable assembly comprising:

a printed circuit board having a pattern of conductive traces on at least a major planar surface of the board;

a cable having a plurality of conductors electrically connected to the traces;

a plurality of elongated spring contact elements connected to the board;

each contact element having a sleeve oriented parallel to the major surface and connected to a first pad portion of a selected trace; and each contact element having a spring pin slidably received in the sleeve and extending beyond a first peripheral edge portion of the board.

2. The cable assembly of claim 1 wherein the cable is a ribbon including a plurality of parallel wires arranged at a selected spacing.

3. The cable assembly of claim 2 wherein the board includes an array of wire contact pads arranged at the selected spacing.

4. The cable assembly of claim 3 wherein the array is spaced apart from a second peripheral edge portion of the board, and the board includes a shield contact pad between the array and the edge portion.

5. The cable assembly of claim 1 wherein the board includes a ground plane element spaced a selected distance below the major planar surface.

6. The cable assembly of claim 5 wherein the ground plane element has at least two portions, each spaced at a different distance below the major planar surface.

7. The cable assembly of claim 5 wherein each wire includes a central conductor surrounded by a conductive shield, and wherein each shield is connected to the ground plane.

8. The cable assembly of claim 1 wherein the board has opposed major surfaces, each including conductive traces, and wherein a plurality of spring contact elements is connected to each major surface.

9. The cable assembly of claim 8 wherein a cable is connected to each major surface of the board.

10. The cable assembly of claim 8 wherein the board includes at least two ground planes, each positioned a selected distance from a respective adjacent major surface.

11. The cable assembly of claim 1 wherein the spring contacts are arranged in parallel with each other, and extend in a common direction perpendicular to the first peripheral edge portion.

12. The cable assembly of claim 1 wherein the board includes an array of cable contact pads having a first spacing to which the cable conductors are connected, and wherein the pad portions are arranged in a second array having a second spacing.

13. The cable assembly of claim 12 wherein the second spacing is smaller than the first spacing.

14. The cable assembly of claim 1 including a housing element connected to the board and having a conductive shield spaced apart from and overlaying the major surface of the board, the shield being electrically connected to a ground contact on the board.

15. The cable assembly of claim 14 wherein the cable includes a plurality of wires each having a central conductor extending from an insulating sleeve, with a conductive shield wrapped about the sleeve, and wherein a portion of the shield of each wire is exposed and contacted by a the shield of the housing.

16. The cable assembly of claim 14 wherein the housing element has an interior surface facing the board, and the interior surface is coated with a conductive material to provide the conductive shield.

17. A cable terminal comprising:

a printed circuit board having a pattern of conductive traces on at least a major planar surface of the board;

a plurality of elongated spring contact elements connected to the board;

each contact element having a sleeve oriented parallel to the major surface and connected to a first pad portion of a selected trace; and each contact element having a spring pin slidably received in the sleeve and extending beyond a first peripheral edge portion of the board.

18. The cable terminal of claim 17 wherein the board includes an array of evenly spaced apart cable contact pads.

19. The cable terminal of claim 17 wherein the board has opposed major surfaces, each including conductive traces, and wherein a plurality of spring contact elements is connected to each major surface.

20. The cable terminal of claim 17 including a housing element connected to the board and having a conductive shield spaced apart from and overlaying the major surface of the board, the shield being electrically connected to a ground contact on the board.

* * * * *